(12) United States Patent
Xia et al.

(10) Patent No.: US 12,106,015 B2
(45) Date of Patent: Oct. 1, 2024

(54) METHOD AND SYSTEM FOR EVALUATING AND SIMULATING NUCLEAR POWER PLANT BASED ON MODEL

(71) Applicant: HARBIN ENGINEERING UNIVERSITY, Heilongjiang (CN)

(72) Inventors: Genglei Xia, Heilongjiang (CN); Yuandong Zhang, Heilongjiang (CN); Chenyang Wang, Heilongjiang (CN); Minjun Peng, Heilongjiang (CN); Bowen Zhang, Heilongjiang (CN); Jilin Sun, Heilongjiang (CN)

(73) Assignee: HARBIN ENGINEERING UNIVERSITY, Harbin (CN)

( * ) Notice: Subject to any disclaimer, the term of this patent is extended or adjusted under 35 U.S.C. 154(b) by 0 days.

(21) Appl. No.: 18/618,218

(22) Filed: Mar. 27, 2024

(65) Prior Publication Data

US 2024/0242001 A1 Jul. 18, 2024

Related U.S. Application Data

(63) Continuation of application No. PCT/CN2023/114220, filed on Aug. 22, 2023.

(30) Foreign Application Priority Data

Oct. 8, 2022 (CN) .......................... 202211221350.1

(51) Int. Cl.
*G06F 30/13* (2020.01)
*G06F 30/20* (2020.01)

(52) U.S. Cl.
CPC .................................. *G06F 30/13* (2020.01)

(58) Field of Classification Search
CPC ........................................................ G06F 30/13
USPC ............................................................. 703/1
See application file for complete search history.

(56) References Cited

U.S. PATENT DOCUMENTS

| 8,150,557 | B2 * | 4/2012 | Taft .......................... H02J 3/144 |
| | | | 700/297 |
| 9,945,264 | B2 * | 4/2018 | Wichmann ................ G05F 1/66 |
| 2014/0337816 | A1 | 11/2014 | Chiluvuri | |

FOREIGN PATENT DOCUMENTS

| CN | 108875151 A | 11/2018 |
| CN | 112597654 A | 4/2021 |
| CN | 113255282 A | 8/2021 |
| CN | 114491817 A | 5/2022 |
| CN | 115510663 A | 12/2022 |
| WO | 2022110435 A1 | 6/2022 |

OTHER PUBLICATIONS

Notification to Grant Patent for China Application No. 202211221350. 1, mailed Apr. 5, 2023.

* cited by examiner

*Primary Examiner* — Andre Pierre Louis
(74) *Attorney, Agent, or Firm* — Piloff Passino & Cosenza LLP; Rachel K. Piloff; Sean A. Passino

(57) ABSTRACT

A method and a system for evaluating and simulating a nuclear power plant based on a model are provided, which includes a plant top-level demand module, a function realization module, a logical architecture construction module, an evaluation and simulation configuration module, a function evaluation module, an overall performance evaluation module, a data information communication module and a model base module.

10 Claims, 13 Drawing Sheets

Req|Overall performance demands| Ocean floating nuclear power plant[Demand Diagram]

《Overall performance demands》
Ocean floating nuclear power plant

«include» — "Overall performance demands": Performance demands
Overall performances related to nuclear power system tasks, power level, life, core performance, running transient response capability, radiation exposure, etc.

«include» — "Overall performance demands": Maneuverability demands
The nuclear power system completes timely and moderate power adjustment by the tracking of the demands of the running state, so as to realize the system mobility and flexibility «include» — "Overall performance demands": Environment adaptability demands
The demand indexes introduced by the pointer to the application environment characteristics of nuclear power ocean floating platform «include» — "Overall performance demands": Security demands
The resistance of nuclear power ocean floating platform to accidents, the ability to prevent core damage with the intervention of safety system, and the ability to mitigate the consequences under serious accidents «include» — "Overall performance demands": Structure demands
The structural design demands applicable to all buildings, structures, systems and devices of the nuclear power ocean floating platform «include» — "Overall performance demands": Material demands
The materials based on successful use and demonstration, and relevant design and operation experience may avoid material failure and reduce the release of corrosion products and other specific species «include» — "Overall performance demands": Reliability demands
The operation strategy and system characteristics are put forward to improve the reliability of the system by designing research methods and application experience, and ensuring the system to complete the established functional demands «include» — "Overall performance demands": Operability and maintainability demands
It mainly focuses on operability, maintainability and protection of operation and maintenance personnel «include» — "Overall performance demands": Device monitoring demands
Through the interaction of instrument control system, the data monitoring of system and device is realized, so as to realize the safe and efficient operation of the system

FIG. 3A

Req[ Overall function decomposition ] Ocean floating nuclear power plant [Function Diagram]

"Overall function decomposition"
Primary loop system functions

《include》 — "Function module"
During normal operation, the core heat is transferred to the secondary working medium of the steam generator.

《include》 — "Function module"
When stopping the reactor, the residual heat is discharged in the reactor core.

《include》 — "Function module"
As the coolant pressure boundary, radioactive diffusion is prevented.

《include》 — "Function module"
The steam-water interface is ensured in the regulator and monitored under all operating conditions.

《include》 — "Function module"
During the accident, emergency cooling of the core is realized by natural circulation of coolant.

《include》 — "Function module"
In a serious accident, non-condensable gas is discharged from the high point of the reactor coolant system

FIG. 4C

METHOD AND SYSTEM FOR EVALUATING AND SIMULATING NUCLEAR POWER PLANT BASED ON MODEL

CROSS-REFERENCE TO RELATED APPLICATIONS

This application is a continuation of PCT/CN2023/114220, filed on Aug. 22, 2023, and claims priority of Chinese Patent Application No. 202211221350.1, filed on Oct. 8, 2022, the entire contents of which are incorporated herein by reference.

TECHNICAL FIELD

The application belongs to the technical field of nuclear power plant simulation, and in particular relates to a method and a system for evaluating and simulating a nuclear power plant based on a model.

BACKGROUND

In order to meet the growing demand of marine energy market, various new design concepts of ocean floating nuclear power plants, such as offshore nuclear power floating platforms, deep-sea nuclear submarines and nuclear power unmanned submersibles, are conceived one after another. However, due to the lack of mature experience in the design, research and development of nuclear power plants, the technical maturity in the design scheme stage is relatively low, so a lot of unpredictable technical, schedule and financial risks emerge.

The design, research and development of the nuclear power plants has the characteristics of long periods and many coupling relations, which are often accompanied by changes and adjustments in overall planning, user needs and technical indexes. However, the conventional evaluation and optimization of the nuclear power plants are mostly based on the form of documents, which leads to a heavy workload of adjusting technical documents and design drawings after design changes, resulting in a huge waste of resources such as manpower, schedule and funds. Meanwhile, after the design changes, other related index parameters or overall technical performance may not meet the overall demand and technical demands, and the repeated adjustment of the design process may easily lead to problems such as non-convergence of the scheme, which makes the technical state of the system difficult to solidify. In addition, the evaluation and optimization work is often carried out independently in each system, specialty and stage, without the integration of change, verification and feedback, which easily leads to the disconnection between design parameters and demand indexes.

The application modeling method of model-based systems engineering (MBSE) may support all demands, design, analysis, inspection and verification from the conceptual design stage of system engineering to the design, analysis, optimization process throughout the whole project and the subsequent engineering life cycle process. Therefore, the application of MBSE in the design, evaluation and optimization process of the nuclear power plants may achieve good cooperation among the subsystems, devices and components, and ensure the overall quality of the system by using the closed-loop mode of demand-design-evaluation-confirmation. Moreover, a good MBSE ideological architecture may improve the efficiency of engineering design and analysis of complex systems and ensure the unification and traceability of data information of related disciplines and specialties.

However, at present, the application method of MBSE in the design and evaluation of nuclear power plants is almost blank, and there is not enough nuclear power system performance evaluation practice as a method support to demonstrate the application feasibility of MBSE. In addition, in the face of complex nuclear power system engineering involving multi-disciplines and multi-disciplines, the coupling and collaboration technology between MBSE system engineering concept and existing simulation models is also urgently needed to be put forward.

Therefore, it is an urgent problem for technicians in this field to put forward an effective application method of system engineering based on a model in the evaluation and simulation of nuclear power plants, so as to improve the design, research and development.

SUMMARY

The application provides a method and a system for evaluating and simulating a nuclear power plant based on a model, which may effectively combine the system engineering concept based on a model with the evaluation and simulation technology of the nuclear power plant, open a closed loop of "demand-design-evaluation-confirmation" nuclear power plant design and simulation, and ensure the unification and traceability of data information between various system devices, disciplines and specialties while improving research efficiency.

In order to achieve the above objective, the application provides the following scheme.

A method for evaluating and simulating a nuclear power plant based on a model, includes following steps.

S1, analyzing a top-level demand of the nuclear power plant based on application scenarios and mission profiles, constructing a demand model, and obtaining a downward output of the demand model based on the demand model;

S2, benchmarking the downward output of the demand model to form a nuclear power plant function mapping, and completing a construction of a function model and an output of data information based on the nuclear power plant function mapping and specific functions to be executed by subsystems, devices and components of the top-level demand of the nuclear power plant;

S3, integrating port information, upstream and downstream elements and the data information to be transferred between the demand model and the function model, and constructing a logical architecture model based on a demand distribution of the demand model, specific conditions of a function decomposition of the function model and a structure of the nuclear power plant;

S4, constructing an evaluating and simulating model of the nuclear power plant based on a design scheme, a working principle of the nuclear power plant, and a parameter configuration, a topological structure connection completed by an evaluation and simulation;

S5, simulating and analyzing operation characteristics of the subsystems, the devices and the components based on the evaluating and simulating model of the nuclear power plant, and constructing a function evaluation model;

S6, constructing an overall performance evaluation model based on the function evaluation model and a simulation demonstration of an overall performance evaluation of the nuclear power plant; and S7, constructing a data information communication model, realizing an information interaction among the demand model in the S1, the function model in the S2, the logical architecture model in the S3, the evaluating and simulating model of the nuclear power plant in the S4, the function evaluation model in the S5 and the overall performance evaluation model in the S6, and completing the evaluation and simulation of the nuclear power plant based on the model.

Optionally, the demand model, the function model and the logical architecture model all realize a graphical representation by a modeling language SysML (System Modeling Language).

Optionally, the information interaction in the S7 includes a one-on-one mapping among the demand model in the S1, the function model in the S2, the logical architecture model in the S3 and the evaluating and simulating model of the nuclear power plant in the S4, the function evaluation model in the S5 and the overall performance evaluation model in the S6, and an evaluation demonstration of comprehensive performance indexes; and the evaluation demonstration of the comprehensive performance indexes includes a function evaluation feedback and a performance evaluation feedback.

Optionally, the data information communication model in the S7 realizes a model conversion and a data transfer among the demand model in the S1, the function model in the S2, the logical architecture model in the S3 and the evaluating and simulating model of the nuclear power plant in the S4, the function evaluation model in the S5 and the overall performance evaluation model in the S6 based on an XMI (XML (Extensible Markup Language) Metadata Interchange) standard, an AP233 (Application Protocol 233) standard exchange protocol and an FMI (Functional Mockup Interface) interface standard Optionally, the method for evaluating and simulating the nuclear power plant based on the model further includes constructing a model base, and the model base is used to encapsulate the demand model in the S1, the function model in the S2, the logical architecture model in the S3, the evaluating and simulating model of the nuclear power plant in the S4, the function evaluation model in the S5, the overall performance evaluation model in the S6 and the data information communication model in the S7.

A system for evaluating and simulating the nuclear power plant based on the model includes a plant top-level demand module, a function realization module, a logical architecture construction module, an evaluation and simulation configuration module, a function evaluation module, an overall performance evaluation module and a data information communication module;

the plant top-level demand module is used for analyzing a top-level demand of the nuclear power plant based on application scenarios and mission profiles of the nuclear power plant, constructing a demand model, and obtaining a downward output of the demand model based on the demand model;

the function realization module is used for benchmarking the downward output of the demand model to form a nuclear power plant function mapping, and completing a construction of a function model and an output of data information based on the nuclear power plant function mapping and specific functions to be executed by subsystems, devices and components of the top-level demand of the nuclear power plant;

the logical architecture construction module is used for integrating port information, upstream and downstream elements and the data information to be transferred between the demand model and the function model, and constructing a logical architecture model based on a demand distribution of the demand model, specific conditions of a function decomposition of the function model and a structure of the nuclear power plant;

the evaluation and simulation configuration module is used for constructing an evaluating and simulating model of the nuclear power plant based on a design scheme, a working principle of the nuclear power plant, and a parameter configuration, a topological structure connection completed by the evaluation and simulation;

the function evaluation module is used for simulating and analyzing operation characteristics of the subsystems, the devices and the components based on the evaluating and simulating model of the nuclear power plant, and constructing a function evaluation model;

the overall performance evaluation module is used for constructing an overall performance evaluation model based on the function evaluation model and a simulation demonstration of an overall performance evaluation of the nuclear power plant; and the data information communication module is used for constructing a data information communication model, realizing an information interaction among the plant top-level demand module, the function realization module, the logical architecture construction module, the evaluation and simulation configuration module, the function evaluation module, the overall performance evaluation module, and completing the evaluation and simulation of the nuclear power plant based on the model.

Optionally, the information interaction in the data information communication module includes a one-on-one mapping among the plant top-level demand module, the function realization module, the logical architecture construction module, the evaluation and simulation configuration module, the function evaluation module and the overall performance evaluation module, and an evaluation demonstration of comprehensive performance indexes; and the evaluation demonstration of the comprehensive performance indexes includes a function evaluation feedback and a performance evaluation feedback.

Optionally, the plant top-level demand module, the function realization module and the logical architecture construction module realize a graphical representation by a modeling language SysML (System Modeling Language).

Optionally, the data information communication module realizes a model conversion and a data transfer among the plant top-level demand module, the function realization module, the logical architecture construction module, the evaluation and simulation configuration module, the function evaluation module and the overall performance evaluation module based on an XMI standard, an AP233 standard exchange protocol and an FMI interface standard.

Optionally, the system for the evaluation and simulation of the nuclear power plant based on the model further includes a model base module, where the model base module is used for constructing a model base to encapsulate the plant top-level demand module, the function realization module, the logical architecture construction module, the evaluation and simulation configuration module, the function evaluation module, the overall performance evaluation module and the data information communication module.

The application has the following beneficial effects: the application may break through the conventional evaluation and analysis method based on the form of documents, realize the effective combination of system engineering concept based on a model and evaluation and simulation technology of nuclear power plant, and filling the blank of MBSE in the field of nuclear engineering simulation at present.

Moreover, the application may effectively improve the research and development efficiency of nuclear power plants, ensure the integrity, systematicness, relevance and traceability of data information in the design and evaluation process, and open a closed-loop method of "demand-design-evaluation-confirmation". This system has broad promotion space and use value.

BRIEF DESCRIPTION OF THE DRAWINGS

In order to explain the technical scheme of this application more clearly, the drawings needed in the embodiments are briefly introduced below. Obviously, the drawings in the following description are only some embodiments of this application. For ordinary technicians in this field, other drawings may be obtained according to these drawings without paying creative labor.

FIG. 3A shows the overall performance requirement model of the top-level demand module of the floating nuclear power plant.

FIG. 4C shows the primary loop system function model of the function realization module of the floating nuclear power plant (in which the primary loop system function model is also a part of the overall function model).

DETAILED DESCRIPTION OF THE EMBODIMENTS

In the following, the technical schemes in the embodiments of the application will be clearly and completely described with reference to the drawings in the embodiments of the application. Obviously, the described embodiments are only a part of the embodiments of the application, but not the whole embodiments. Based on the embodiments in this application, all other embodiments obtained by ordinary technicians in this field without creative work belong to the protection scope of this application.

In order to make the above objectives, features and advantages of this application more obvious and easier to understand, the application will be further described in detail with the attached drawings and specific embodiments.

Figure 1:
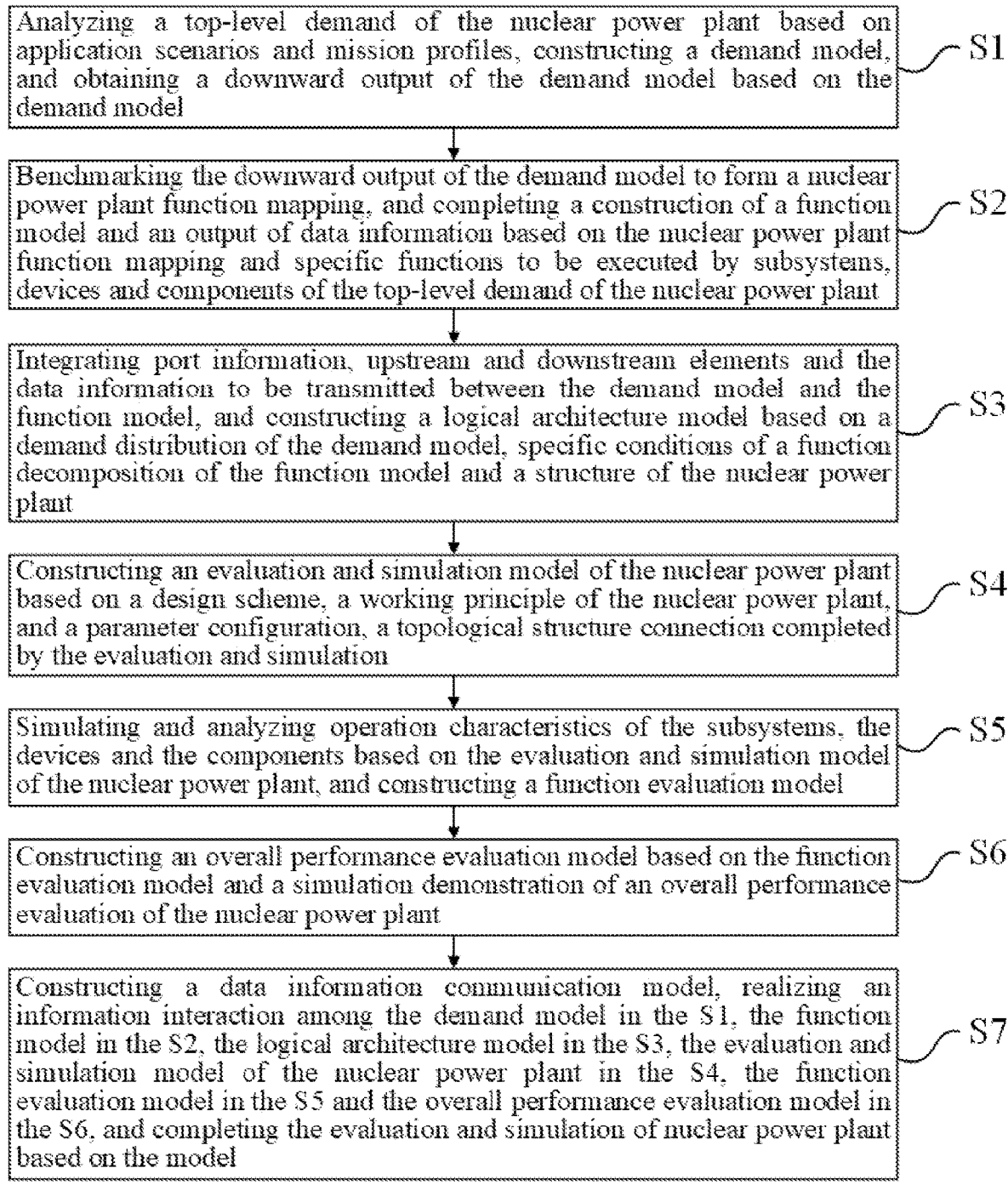
FIG. 1 is a flow chart of a method for evaluating and simulating nuclear power plant based on a model according to Embodiment 1 of the present application.

Embodiment 1: A Method for Evaluating and Simulating Nuclear Power Plant Based on a Model Embodiment 1 of the present application discloses a method for evaluating and simulating nuclear power plant based on a model, as shown in FIG. 1, including the following steps:
step 1: the top-level demand analysis and modeling expression of nuclear power plant are carried out around the application scenarios and typical mission profiles of the research object based on the development of relevant policies and strategies, and the demand model is constructed and a downward output of the demand model is realized;
step 2: the downward output of the demand model is benchmarked to form a nuclear power plant function mapping, and a construction of a function model and an output of data information are completed based on the nuclear power plant function mapping and specific functions to be executed by subsystems, devices and components of the top-level demand of the nuclear power plant;
step 3: port information, upstream and downstream elements and the data information to be transferred between the demand model and the function model are integrated, and a logical architecture model is constructed based on a demand distribution of the demand model, specific conditions of a function decomposition of the function model and a structure of the nuclear power plant;
step 4: an evaluating and simulating model of the nuclear power plant is constructed based on a design scheme, a working principle of the nuclear power plant, and a parameter configuration, a topological structure connection completed by the evaluation and simulation;
step 5: operation characteristics of the subsystems, the devices and the components are simulated and analyzed based on the evaluating and simulating model of the nuclear power plant, and constructing a function evaluation model;
step 6: an overall performance evaluation model is constructed based on the function evaluation model and a simulation demonstration of an overall performance evaluation of the nuclear power plant; and
step 7: the information interaction and data analysis are realized between the constructing process of the comprehensive performance index system model of the nuclear power plant in steps 1-3, namely the demand model, the function model and the logical architecture model, and the nuclear power plant simulation model and the evaluation calculation results in steps 4-6, namely the evaluating and simulating model of the nuclear power plant, the function evaluation model and the overall performance evaluation model, the one-on-one mapping of the demand, function, architecture and evaluating and simulating model in the index system model and the evaluation demonstration of comprehensive performance indexes are realized, and the closed-loop research approach of "demand-design-evaluation-confirmation" of the method for evaluating and simulating nuclear power plant based on a model is completed.

This method also constructs a model base, which encapsulates the demand model, function model, logical architecture model, evaluating and simulating model of the nuclear power plant, function evaluation model, overall performance evaluation model and data information communication model.

Figure 2:
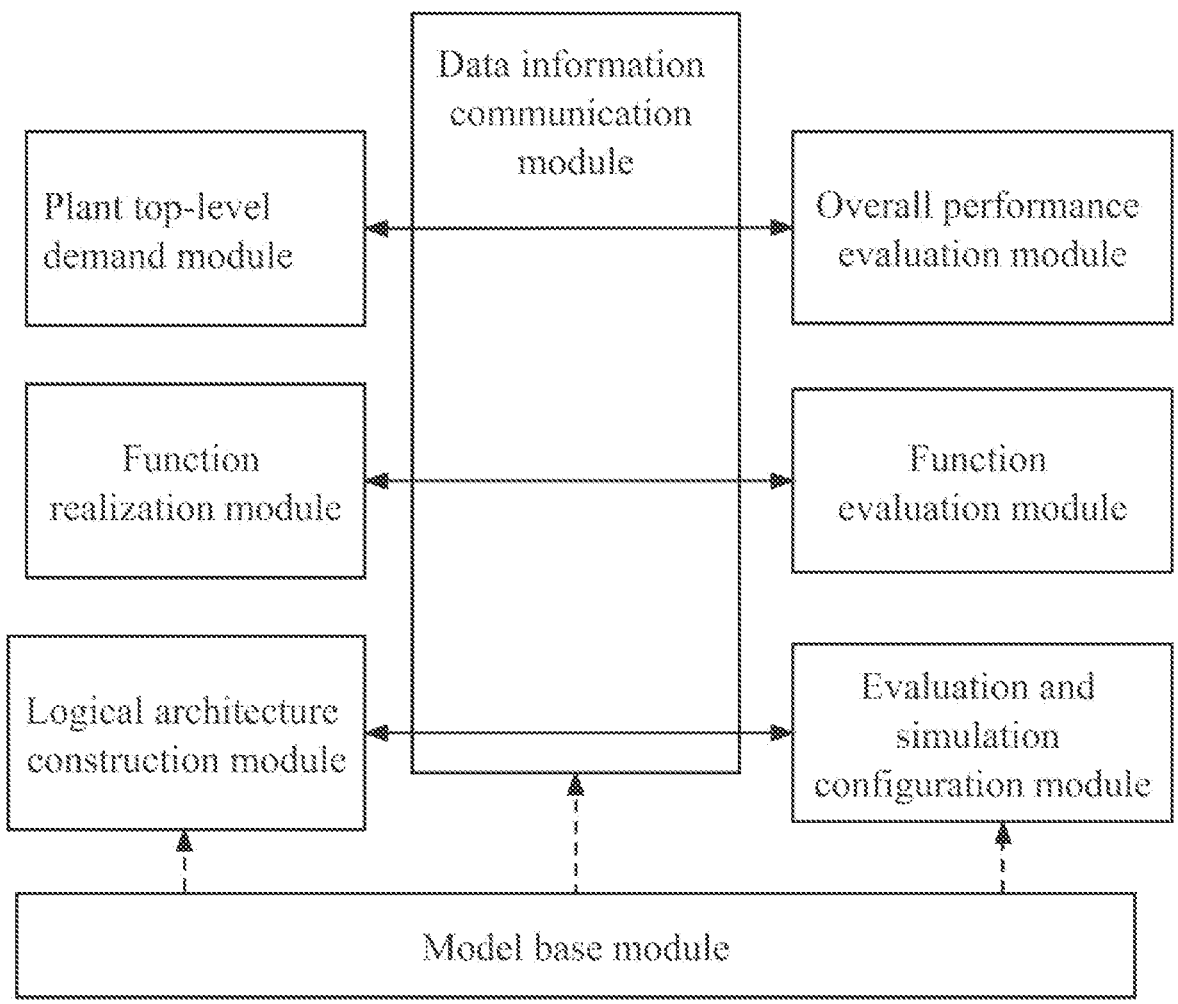
FIG. 2 is a schematic diagram of module connection of a system for evaluating and simulating a nuclear power plant based on a model according to Embodiment 2 of the present application.

Embodiment 2: A System for the Evaluation and Simulation of the Nuclear Power Plant Based on the Model As shown in FIG. 2, a system for the evaluation and simulation of the nuclear power plant based on the model includes a plant top-level demand module, a function realization module, a logical architecture construction module, an evaluation and simulation configuration module, a function evaluation module, an overall performance evaluation module and a data information communication module.

The plant top-level demand module is used for analyzing a top-level demand of the nuclear power plant based on application scenarios and mission profiles of the nuclear power plant, constructing a demand model, and obtaining a downward output of the demand model based on the demand model.

The function realization module is used for forming a nuclear power plant function mapping based on the data information output downwards by the demand model and constructing a function model to obtain the data information based on the specific function behavior content to be executed of each subsystem, device and component based on the top demand of the nuclear power plant.

The logical architecture construction module is used for integrating port information, upstream and downstream elements and the data information to be transferred between the demand model and the function model, and constructing a logical architecture model based on a demand distribution of the demand model, specific conditions of a function decomposition of the function model and a structure of the nuclear power plant to obtain a modeling expression of the comprehensive performance index system of the nuclear power plant.

The evaluation and simulation configuration module is used for constructing an evaluating and simulating model of the nuclear power plant based on a design scheme, a working principle of the nuclear power plant, and a parameter configuration, a topological structure connection completed by the evaluation and simulation.

The function evaluation module is used for simulating and analyzing operation characteristics of the subsystems, the devices and the components based on the evaluating and simulating model of the nuclear power plant, and constructing a function evaluation model to obtain the evaluation of the function realization effect.

The overall performance evaluation module is used for constructing an overall performance evaluation model based on the function evaluation model and a simulation demonstration of an overall performance evaluation of the nuclear power plant, so as to obtain the support for the top-level demand accessibility demonstration.

And the data information communication module is used for constructing a data information communication model, realizing an information interaction among the plant top-level demand module, the function realization module, the logical architecture construction module, the evaluation and simulation configuration module, the function evaluation module, the overall performance evaluation module, and completing the evaluation and simulation of the nuclear power plant based on the model.

The system also includes a model base module, which is used for constructing a model base to encapsulate the plant top-level demand module, the function realization module, the logical architecture construction module, the evaluation and simulation configuration module, the function evaluation module, the overall performance evaluation module and the data information communication module.

It is planned to realize the closed-loop research flow of "demand-design-evaluation-confirmation" for the nuclear power ocean floating platform by using a system for evaluating and simulating a nuclear power plant based on a model disclosed by the application.

In the second specific embodiment, as shown in FIG. 2, a graphical representation of the plant top-level demand module may be realized by the standardized system modeling language SysML, and the top-level performance demands of the nuclear power ocean floating platform may be hierarchically sorted out based on policy standards, user demands and expert experience.

Figure 3B:
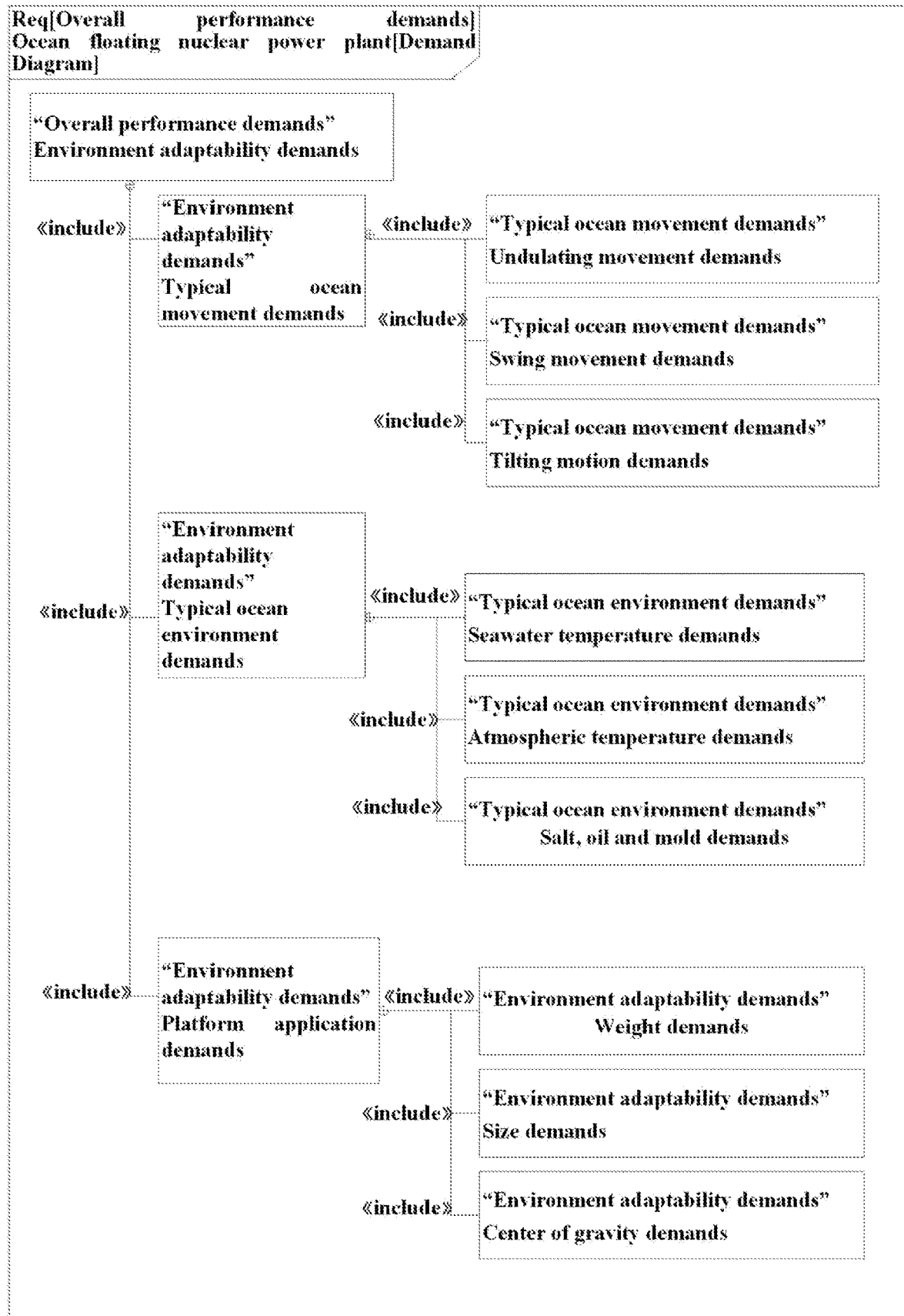
FIG. 3B shows the environment adaptability demand model of the top-level demand module of the floating nuclear power plant (in which the environment adaptability demand model is a part of the overall performance demand model).

Specifically, as shown in FIG. 3, the top-level performance demands of nuclear power ocean floating platform include but are not limited to performance demands, maneuverability demands, environment adaptability demands, security demands, structure demands, material demands, reliability demands, operability and maintainability demands, and device monitoring demands. The environment adaptability demands includes typical ocean movement demands, typical ocean environment demands and platform application demands; each sub-demand includes undulating movement demands, swing movement demands, tilting motion demands, seawater temperature demands, atmospheric temperature demands, salt, oil and mold demands, weight demands, size demands and center of gravity demands.

Figure 4A:
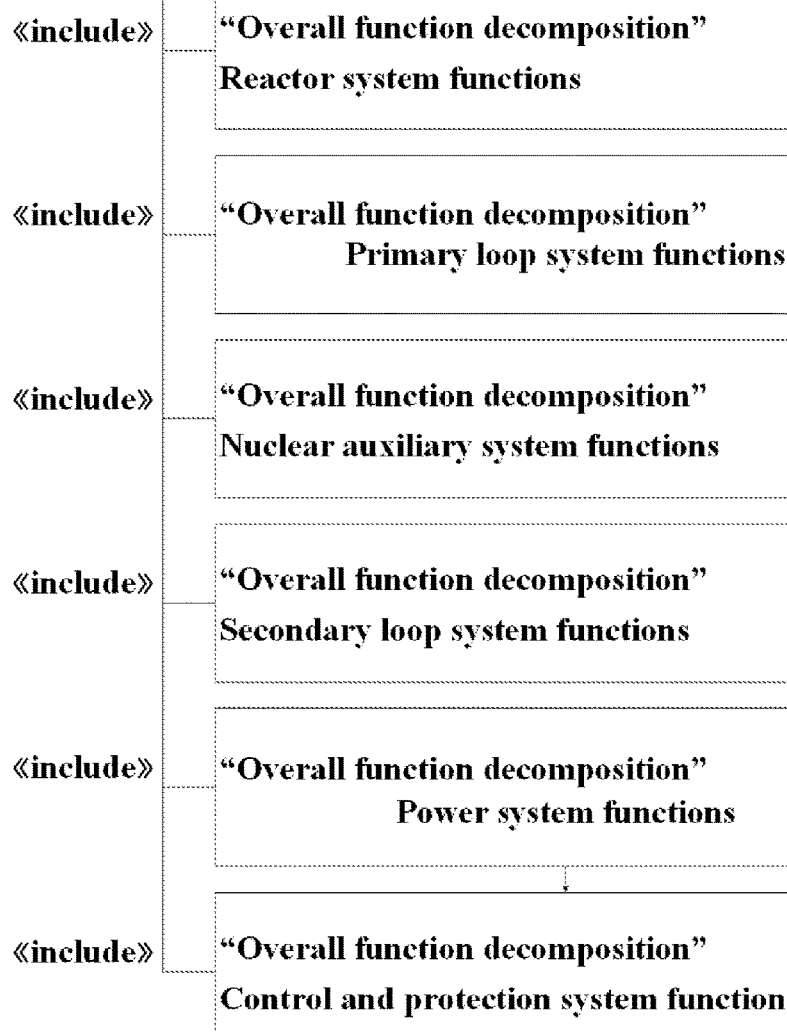
FIG. 4A shows the overall function model of the function realization module of the floating nuclear power plant.
Figure 4B:
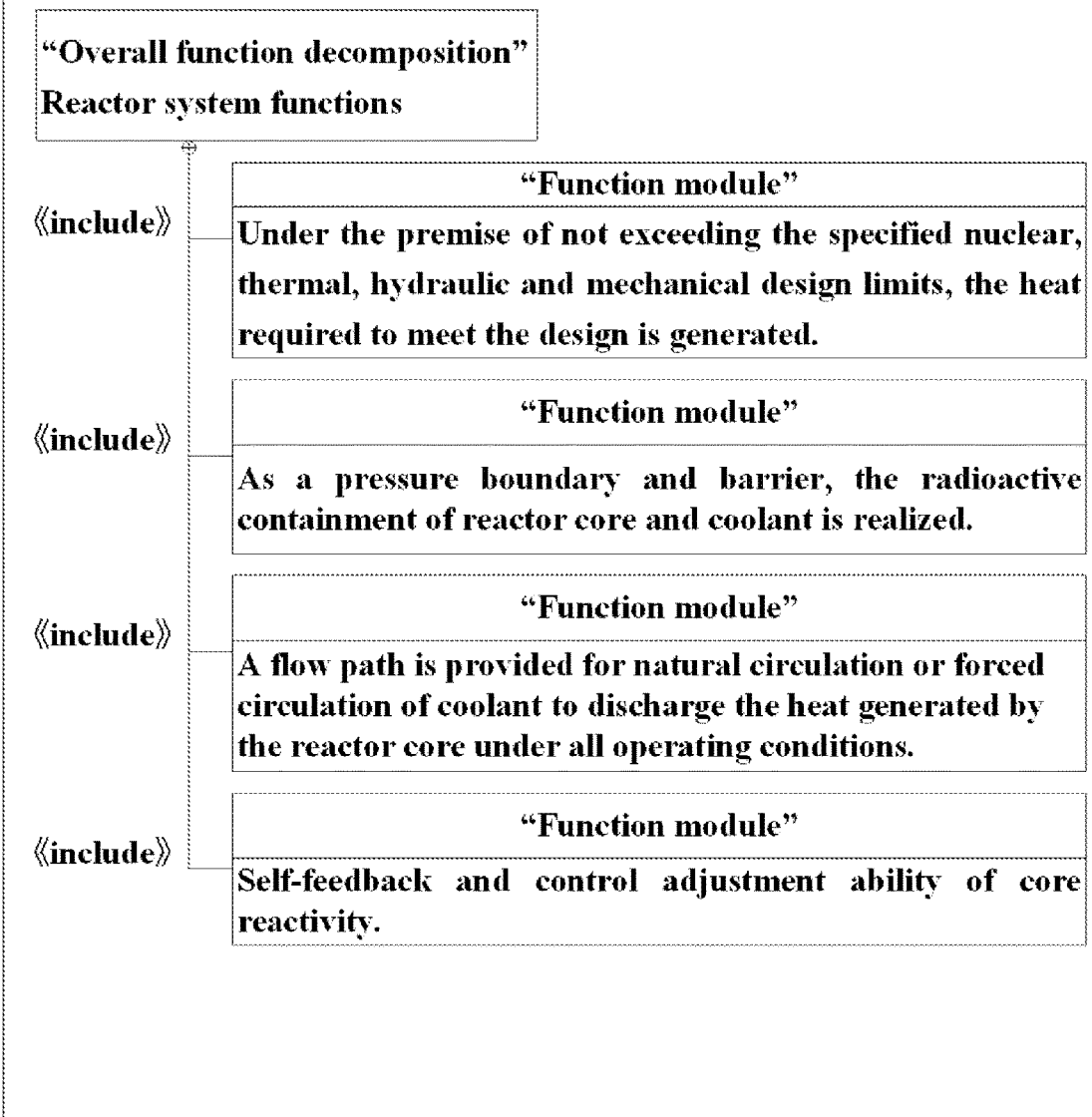
FIG. 4B shows the reactor system function model of the function realization module of the floating nuclear power plant (in which the reactor system function model is a part of the overall function model).

As shown in FIG. 4, a graphical representation of the function realization module may be realized by the standardized system modeling language SysML, and the data information transferred by the plant top-level demand module is benchmarked to complete the function mapping of the nuclear power ocean floating platform, so as to form the specific function contents to be executed by each subsystem, device and component based on the top-level demand.

As shown in FIG. 4, the function realization module of the nuclear power ocean floating platform may be divided into functions including but not limited to reactor system functions, primary loop system functions, nuclear auxiliary system functions, secondary loop system functions, power system functions and control and protection system functions. The reactor system functions may be further disassembled into functions such as generating designed heat, radioactive containment, coolant diversion, reactivity self-adjustment; the primary loop system functions may be further disassembled into functions such as normal heat and decay heat export of the core, coolant pressure boundary, pressure stability, emergency cooling and non-condensable gas discharge.

Figure 5:
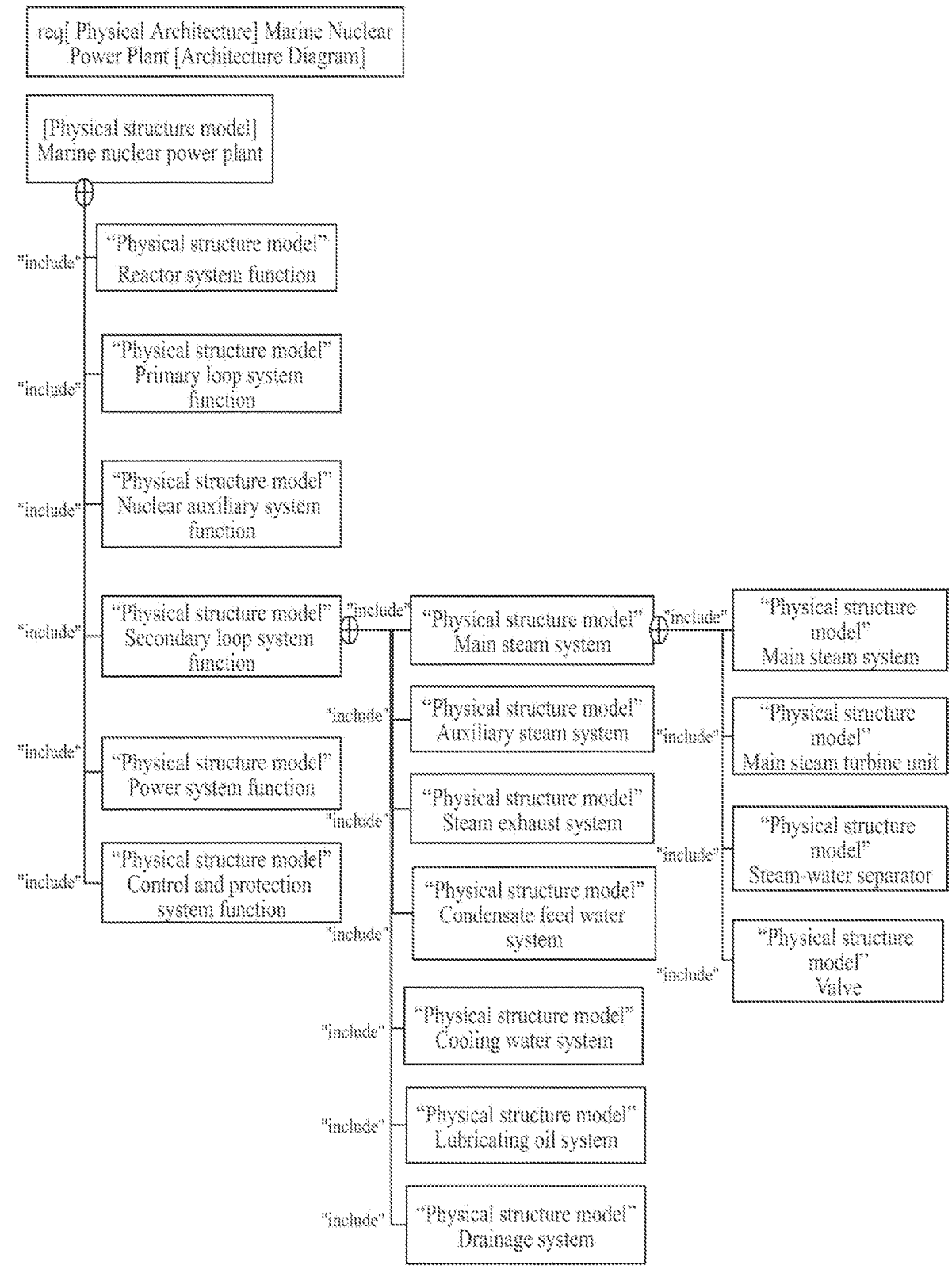
FIG. 5 is a schematic diagram of partial logical architecture module in Embodiment 2 of the present application.
Figure 6A:
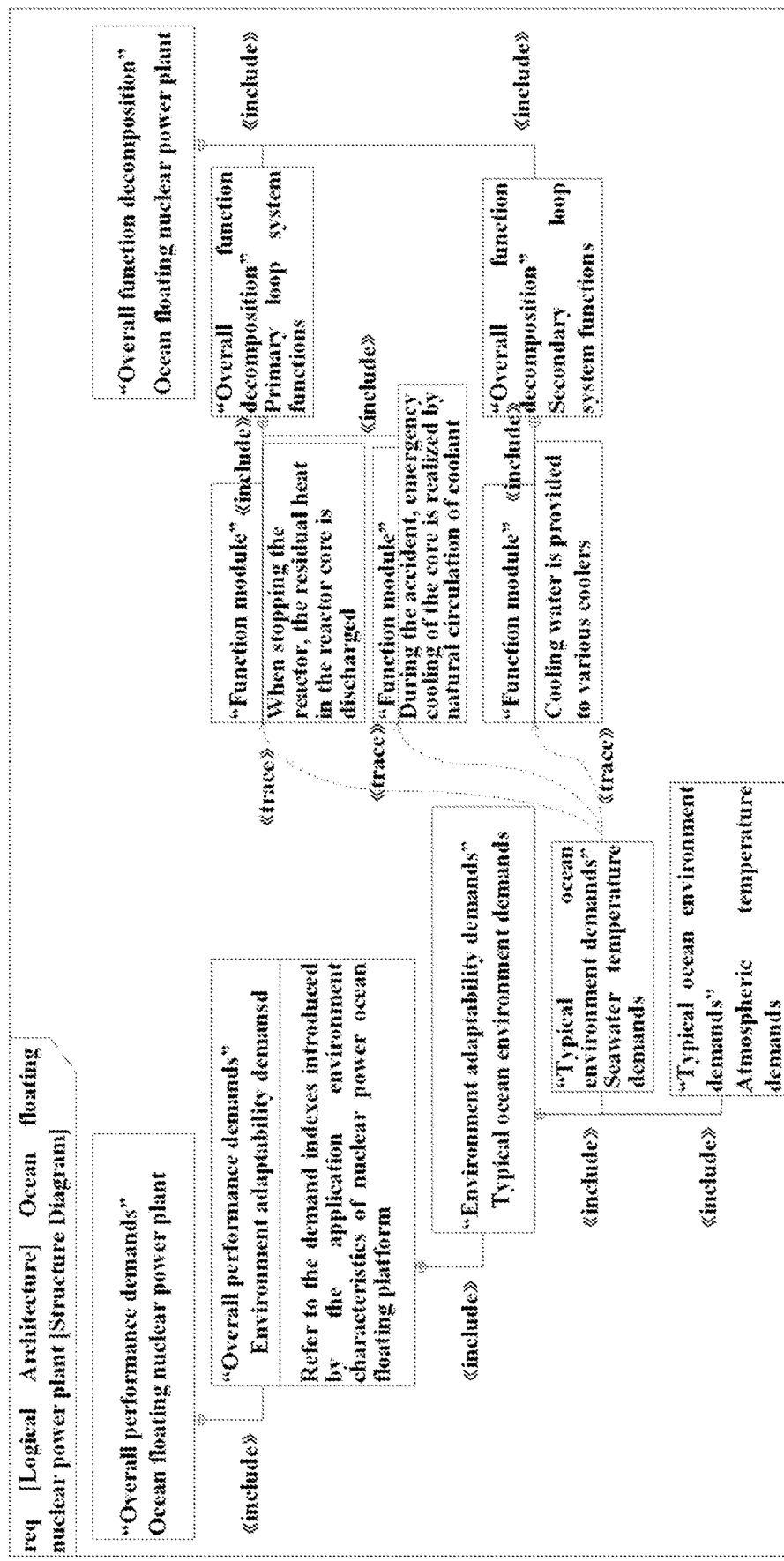
FIG. 6A shows a schematic diagram of the logical architecture model established between seawater temperature demands and some system functions of floating nuclear power plants.
Figure 6B:
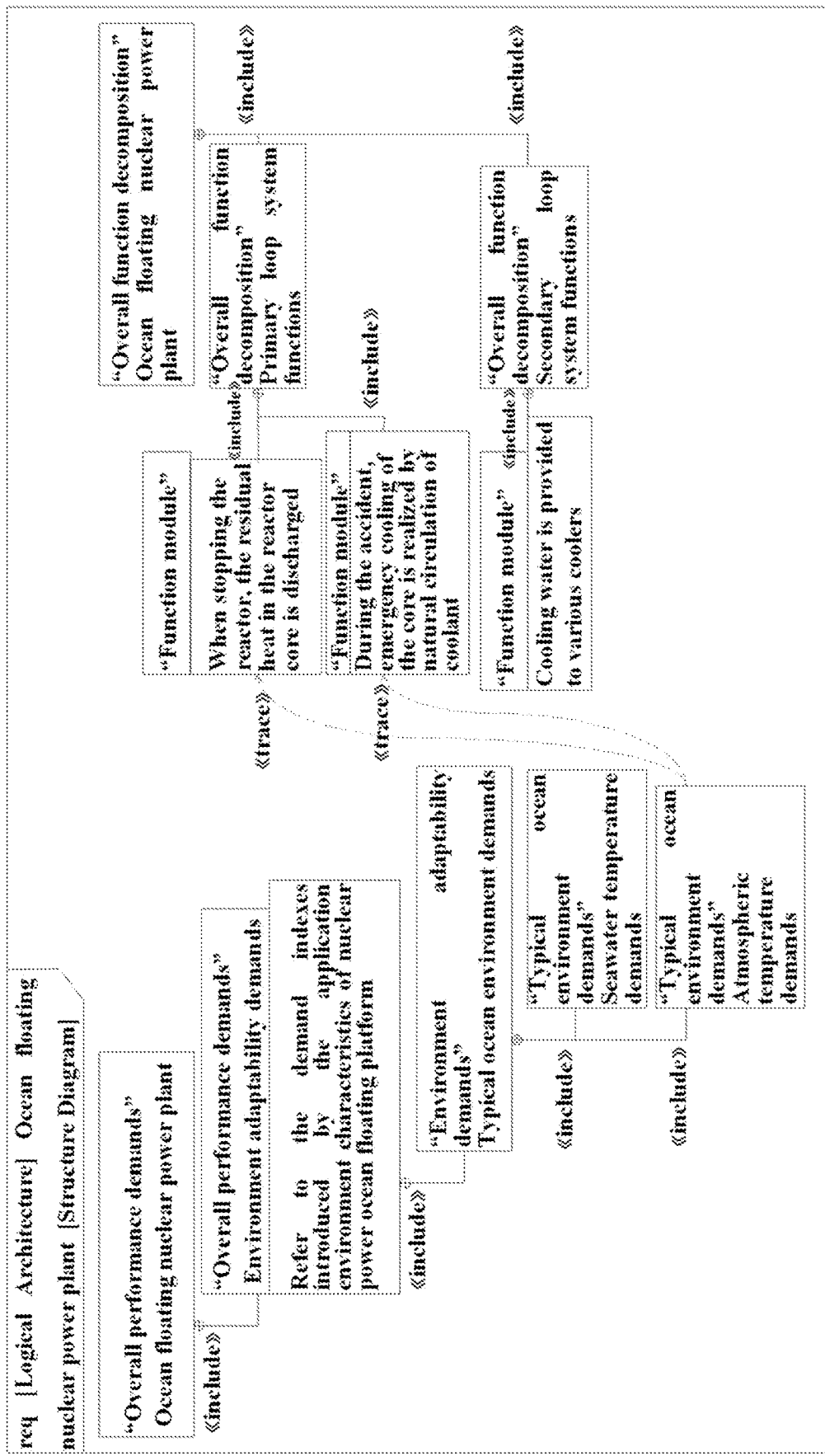
FIG. 6B shows a schematic diagram of the logical architecture model established between the atmospheric temperature demands of floating nuclear power plant and some system functions.

The logical architecture construction module may not only construct the logical architecture model based on the system structure of the research object as shown in FIG. 5, but also may construct a logical architecture between the plant top-level demand module and the function realization module to realize demand transfer and function mapping as shown in FIG. 6.

Specifically, as shown in FIG. 5, the logical architecture construction module may be constructed for the system composition of the nuclear power ocean floating platform through the standardized system modeling language SysML. The nuclear power ocean floating platform mainly includes reactor system functions, primary loop system functions, nuclear auxiliary system functions, secondary loop system functions, power system functions, control and protection system functions. The secondary loop system may be divided into main steam system, auxiliary steam system, steam exhaust system, condensate feed water system, cooling water system, lubricating oil system and drainage system. The main steam system includes main steam pipeline, main steam turbine unit, steam-water separator and related valves. Furthermore, the parameters of each system, device and component in the architecture model are preset, and the parameters may be transferred and mapped to the simulation model in the evaluation and simulation configuration module by using the data transfer model.

Specifically, a modeling expression may be performed by the standardized system modeling language SysML for the logical architecture between the plant top-level demand module and the function realization module of the nuclear power ocean floating platform system, so as to realize the mapping from demands to functions, realize the matching tracking of the function model according to the adjustment of the demand model, and achieve the traceability of indexes.

Specifically, as shown in FIG. 6, taking seawater temperature demands and atmospheric temperature demands in ocean environment demands as an example, the seawater temperature demands and the atmospheric temperature demands will affect the functions of passive residual heat removal system and cooling water system of nuclear power ocean floating platform, so the above two kinds of demands map the functions of shut-down amplifier heat export, core emergency cooling and cooler cooling water supply respectively. When the seawater temperature or atmospheric temperature demand changes, the functions of shut-down amplifier heat export, core emergency cooling and cooler cooling water supply will be matched and adjusted under the traction of the logical architecture model, and the benchmark of demands and functions will be realized.

Specifically, the parameter input and model topology construction of the evaluation and simulation configuration module of the nuclear power ocean floating platform based on fluid network may be completed by solving conservation equations and using graph theory and data card.

Figure 7:
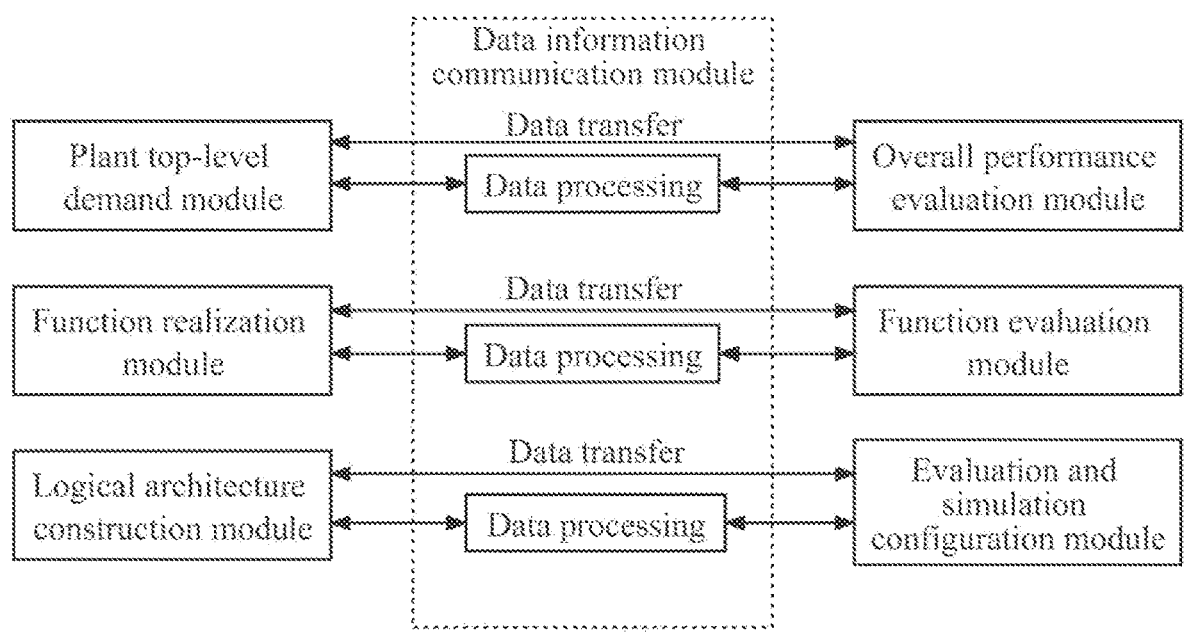
FIG. 7 is a schematic diagram of partial parameter transfer and processing in Embodiment 2 of the present application.

Specifically, as shown in FIG. 7, the information interaction and data analysis between the comprehensive performance index system model of nuclear power ocean floating platform and the evaluating and simulating model of nuclear power ocean floating platform are realized through the standardized data information communication module, so as to realize the one-by-one mapping of demands, functions, architectures and evaluating and simulating models in the index system model and the evaluation demonstration of comprehensive performance indexes, and complete the closed-loop research approach of "demand-design-evaluation-confirmation" of the method for evaluating and simulating nuclear power plant based on a model.

Specifically, the data transfer model in the data information communication module may realize the model transformation and data transfer between the index system model (demand model, function model and logical architecture model) and the evaluating and simulating model (evaluating and simulating model of the nuclear power plant, function evaluation model and overall performance evaluation model) based on the XMI standard, AP233 standard exchange protocol and FMI interface standard.

Specifically, the data processing model in the data information communication module may include analysis models based on numerical logic judgment, artificial neural network, fuzzy comprehensive evaluation, expert fuzzy scoring weight and other methods to realize closed-loop processing of evaluation and simulation calculation results for the comprehensive performance index system.

Figure 8:
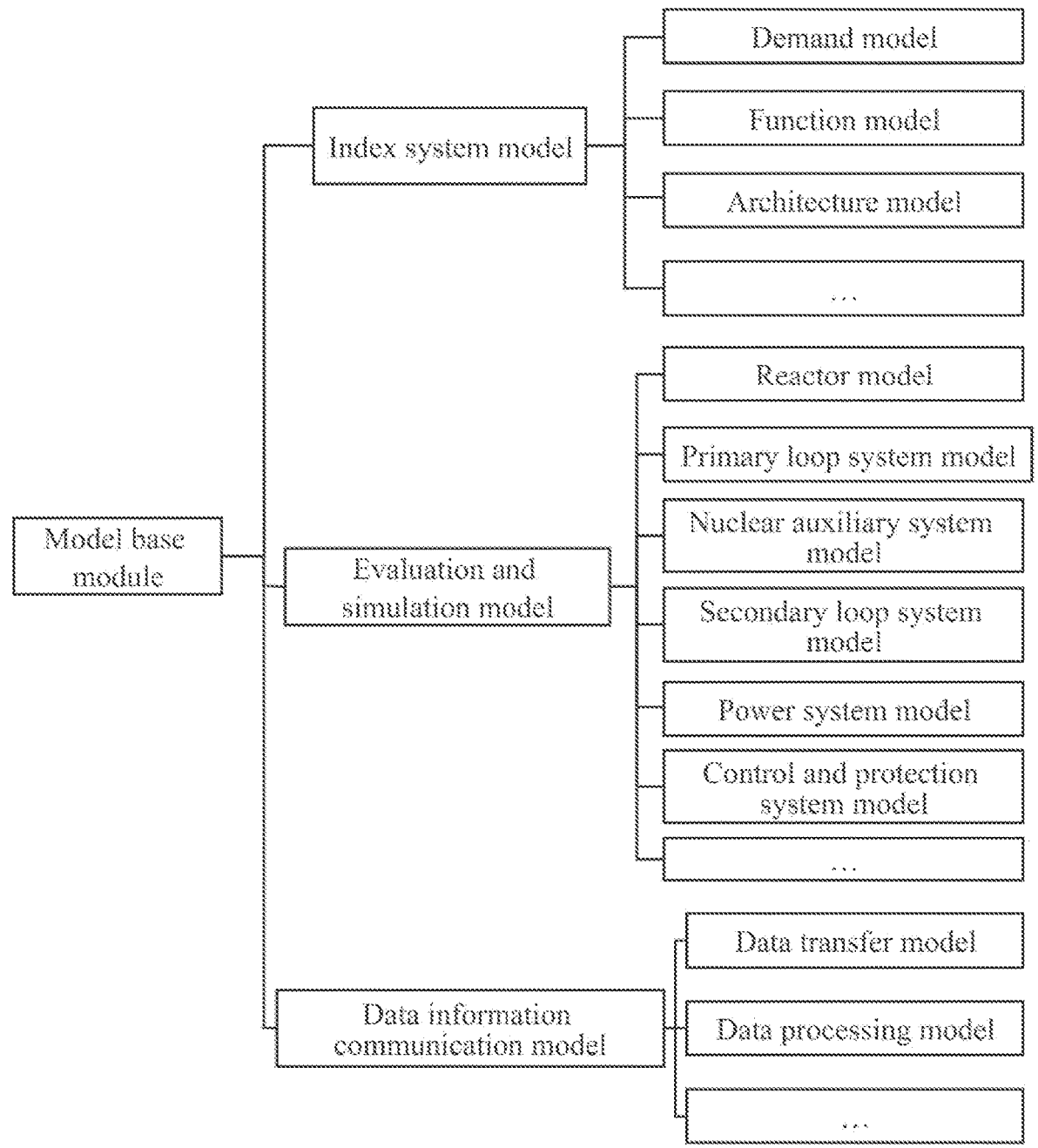
FIG. 8 is a schematic diagram of the data information transfer relationship of the standardized data information communication module in Embodiment 2 of the present application.

Specifically, as shown in FIG. 8, all models involved in the system for evaluating and simulating a nuclear power plant based on a model of the present application are encapsulated in the model base module.

Specifically, as shown in FIG. 8, the index system model in the model base module includes but is not limited to the top-level demand model, function model, logical architecture model. Through the above models, the demands analysis, function decomposition and architecture construction of the nuclear power ocean floating platform may be completed.

Specifically, as shown in FIG. 8, the evaluating and simulating model in the model base module include but are not limited to the reactor model, primary loop system model, nuclear auxiliary system model, secondary loop system model, power system model, control and protection system model. Through the above process, the evaluating and simulating model of nuclear power ocean floating platform may be established.

Figure 9:
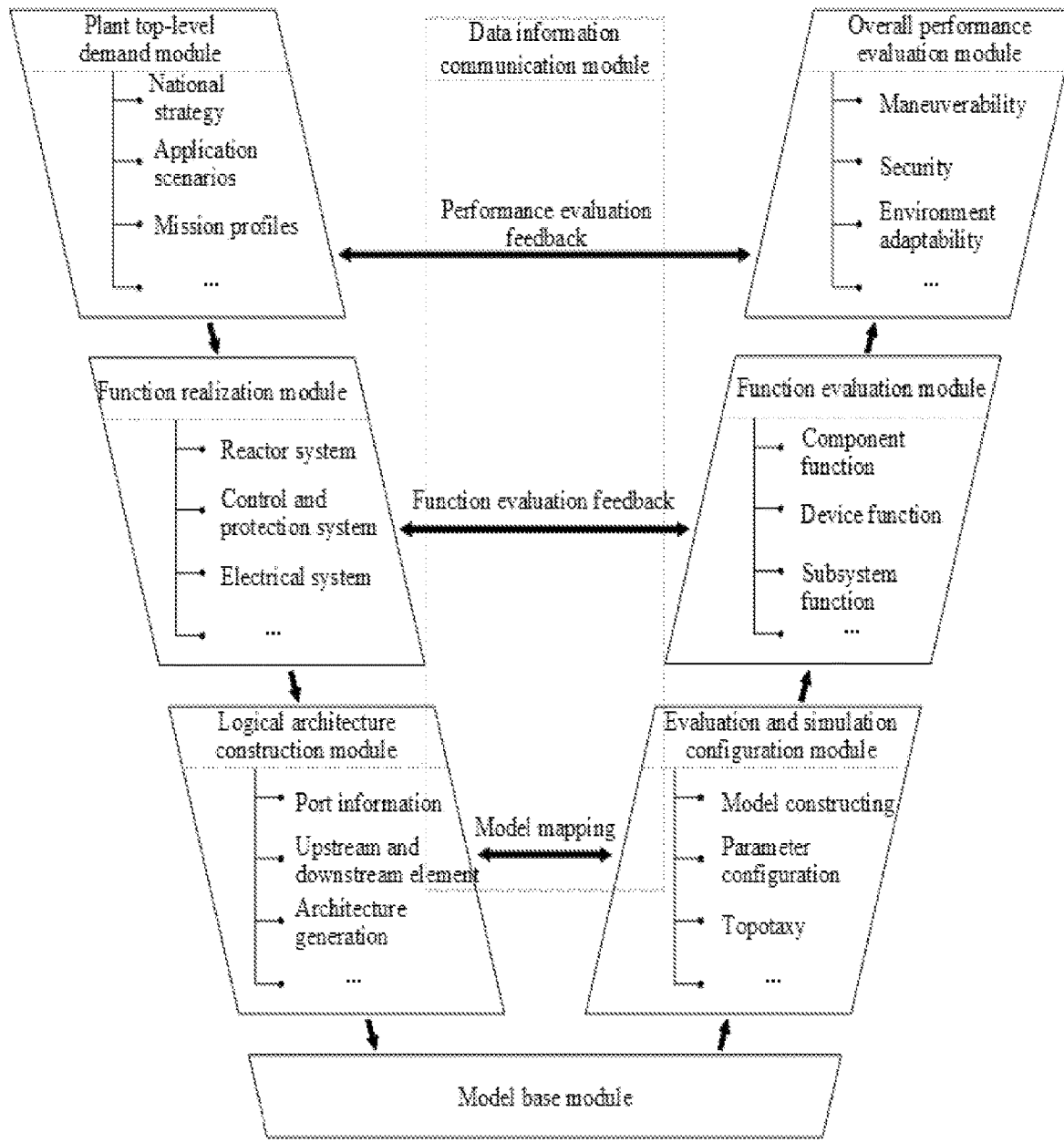
FIG. 9 is a schematic diagram of specific connection of modules in Embodiment 2 of the present application.

Specifically, as shown in FIG. 8, the data information communication model in the model base module includes but is not limited to data transfer model and data processing model. Through the above models, the information transfer and data processing between the index system model of nuclear power ocean floating platform and the evaluating and simulating model may be completed. The specific connection of the modules in this embodiment is shown in FIG. 9.

The above-mentioned embodiment is only a description of the preferred mode of this application, not a limitation on the scope of this application. Without departing from the design spirit of this application, various modifications and improvements made by ordinary technicians in this field to the technical scheme of this application shall fall within the protection scope determined by the claims of this application.

What is claimed is:

1. A method for evaluating and simulating a nuclear power plant based on a model, comprising following steps:
    S1, analyzing a top-level demand of the nuclear power plant based on application scenarios and mission profiles, constructing a demand model, and obtaining a downward output of the demand model based on the demand model;

S2, benchmarking the downward output of the demand model to form a nuclear power plant function mapping, and completing a construction of a function model and an output of data information based on the nuclear power plant function mapping and specific functions to be executed by subsystems, devices and components of the top-level demand of the nuclear power plant;

S3, integrating port information, upstream and downstream elements and the data information to be transferred between the demand model and the function model, and constructing a logical architecture model based on a demand distribution of the demand model, specific conditions of a function decomposition of the function model and a structure of the nuclear power plant;

S4, constructing an evaluating and simulating model of the nuclear power plant based on a design scheme, a working principle of the nuclear power plant, and a parameter configuration, a topological structure connection completed by an evaluation and simulation;

S5, simulating and analyzing operation characteristics of the subsystems, the devices and the components based on the evaluating and simulating model of the nuclear power plant, and constructing a function evaluation model;

S6, constructing an overall performance evaluation model based on the function evaluation model and a simulation demonstration of an overall performance evaluation of the nuclear power plant; and S7, constructing a data information communication model, realizing an information interaction among the demand model in the S1, the function model in the S2, the logical architecture model in the S3, the evaluating and simulating model of the nuclear power plant in the S4, the function evaluation model in the S5 and the overall performance evaluation model in the S6, and completing the evaluation and simulation of the nuclear power plant based on the model.

2. The method for evaluating and simulating a nuclear power plant based on a model according to claim 1, wherein the demand model, the function model and the logical architecture model all realize a graphical representation by a modeling language SysML.

3. The method for evaluating and simulating nuclear power plant based on a model according to claim 1, wherein the information interaction in the S7 comprises a one-on-one mapping among the demand model in the S1, the function model in the S2, the logical architecture model in the S3 and the evaluating and simulating model of the nuclear power plant in the S4, the function evaluation model in the S5 and the overall performance evaluation model in the S6, and an evaluation demonstration of comprehensive performance indexes; and the evaluation demonstration of the comprehensive performance indexes comprises a function evaluation feedback and a performance evaluation feedback.

4. The method for evaluating and simulating a nuclear power plant based on a model according to claim 1, wherein the data information communication model in the S7 realizes a model conversion and a data transfer among the demand model in the S1, the function model in the S2, the logical architecture model in the S3 and the evaluating and simulating model of the nuclear power plant in the S4, the function evaluation model in the S5 and the overall performance evaluation model in the S6 based on an XMI standard, an AP233 standard exchange protocol and an FMI interface standard.

5. The method for evaluating and simulating a nuclear power plant based on a model according to claim 1, wherein the method for evaluating and simulating the nuclear power plant based on the model further comprises constructing a model base, wherein the model base is used to encapsulate the demand model in the S1, the function model in the S2, the logical architecture model in the S3, the evaluating and simulating model of the nuclear power plant in the S4, the function evaluation model in the S5, the overall performance evaluation model in the S6 and the data information communication model in the S7.

6. A system for evaluating and simulating a nuclear power plant based on a model, comprising a plant top-level demand module, a function realization module, a logical architecture construction module, an evaluation and simulation configuration module, a function evaluation module, an overall performance evaluation module and a data information communication module;

wherein the plant top-level demand module is used for analyzing a top-level demand of the nuclear power plant based on application scenarios and mission profiles of the nuclear power plant, constructing a demand model, and obtaining a downward output of the demand model based on the demand model;

the function realization module is used for benchmarking the downward output of the demand model to form a nuclear power plant function mapping, and completing a construction of a function model and an output of data information based on the nuclear power plant function mapping and specific functions to be executed by subsystems, devices and components of the top-level demand of the nuclear power plant;

the logical architecture construction module is used for integrating port information, upstream and downstream elements and the data information to be transferred between the demand model and the function model, and constructing a logical architecture model based on a demand distribution of the demand model, specific conditions of a function decomposition of the function model and a structure of the nuclear power plant;

the evaluation and simulation configuration module is used for constructing an evaluating and simulating model of the nuclear power plant based on a design scheme, a working principle of the nuclear power plant, and a parameter configuration, a topological structure connection completed by the evaluation and simulation;

the function evaluation module is used for simulating and analyzing operation characteristics of the subsystems, the devices and the components based on the evaluating and simulating model of the nuclear power plant, and constructing a function evaluation model;

the overall performance evaluation module is used for constructing an overall performance evaluation model based on the function evaluation model and a simulation demonstration of an overall performance evaluation of the nuclear power plant; and the data information communication module is used for constructing a data information communication model, realizing an information interaction among the plant top-level demand module, the function realization module, the logical architecture construction module, the evaluation and simulation configuration module, the function evaluation module, the overall performance evaluation module, and completing the evaluation and simulation of the nuclear power plant based on the model.

7. The system for evaluating and simulating a nuclear power plant based on a model according to claim 6, wherein
the information interaction in the data information communication module comprises a one-on-one mapping among the plant top-level demand module, the function realization module, the logical architecture construction module, the evaluation and simulation configuration module, the function evaluation module and the overall performance evaluation module, and an evaluation demonstration of comprehensive performance indexes; and
the evaluation demonstration of the comprehensive performance indexes comprises a function evaluation feedback and a performance evaluation feedback.

8. The system for evaluating and simulating a nuclear power plant based on a model according to claim 6, wherein the plant top-level demand module, the function realization module and the logical architecture construction module realize a graphical representation by a modeling language SysML.

9. The system for evaluating and simulating a nuclear power plant based on a model according to claim 6, wherein
the data information communication module realizes a model conversion and a data transfer among the plant top-level demand module, the function realization module, the logical architecture construction module, the evaluation and simulation configuration module, the function evaluation module and the overall performance evaluation module based on an XMI standard, an AP233 standard exchange protocol and an FMI interface standard.

10. The system for evaluating and simulating a nuclear power plant based on a model according to claim 6, wherein
the system for evaluating and simulating the nuclear power plant based on the model further comprises a model base module, wherein the model base module is used for constructing a model base to encapsulate the plant top-level demand module, the function realization module, the logical architecture construction module, the evaluation and simulation configuration module, the function evaluation module, the overall performance evaluation module and the data information communication module.

* * * * *